US007514973B2

(12) United States Patent
Brox

(10) Patent No.: US 7,514,973 B2
(45) Date of Patent: Apr. 7, 2009

(54) CIRCUIT HAVING A CLOCK SIGNAL SYNCHRONIZING DEVICE WITH CAPABILITY TO FILTER CLOCK-JITTER

(75) Inventor: Martin Brox, Munich (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 11/735,748

(22) Filed: Apr. 16, 2007

(65) Prior Publication Data

US 2008/0252346 A1    Oct. 16, 2008

(51) Int. Cl.
*H03L 7/06* (2006.01)
(52) U.S. Cl. ..................................... 327/158; 327/149

(58) Field of Classification Search ...................... None
See application file for complete search history.

(56) References Cited

U.S. PATENT DOCUMENTS

| 6,501,482 | B1 * | 12/2002 | Rosman et al. | ............ 345/587 |
| 6,879,623 | B2 * | 4/2005 | Agami et al. | ............... 375/140 |
| 7,142,026 | B2 * | 11/2006 | Kwak | ......................... 327/158 |

* cited by examiner

*Primary Examiner*—Cassandra Cox
(74) *Attorney, Agent, or Firm*—Dicke, Billig & Czaja, PLLC

(57) ABSTRACT

A circuit having a clock signal synchronizing device with capability to filter clock-jitters is disclosed. One embodiment provides a delayed locked loop with capability to filter clock-jitter. Further, the invention relates to a clock signal synchronizing method with capability to filter clock-jitter.

22 Claims, 4 Drawing Sheets

PRIOR ART

CIRCUIT HAVING A CLOCK SIGNAL SYNCHRONIZING DEVICE WITH CAPABILITY TO FILTER CLOCK-JITTER

BACKGROUND

The invention relates to a circuit having a clock signal synchronizing device, in one embodiment a delayed locked loop (DLL) with capability to filter clock-jitter. Further, the invention relates to a clock signal synchronizing method with capability to filter clock-jitter.

A conventional DLL may—as is illustrated in FIG. 1—e.g., includes a phase detector 11, a variable delay element 12, and a constant delay element 15.

An incoming clock signal is received at an input of the variable delay element 12, delayed by a variable delay of the latter, relayed to the constant delay element 15, delayed by a constant delay of the latter, and then forwarded to the phase detector 11. The phase detector 11 compares the phase of the incoming clock signal received at a first input of the phase detector 11 with the delayed clock signal received from an output of the constant delay element 15 at a second input of the phase detector 11. If the two received clock signals are not in phase, the phase detector 11 adjusts the variable delay of the variable delay element 12, i.e., increases the variable delay by a predetermined process. In other cases, the phase detector 11 may decrease the variable delay by a predetermined process.

Then, a new cycle begins and the incoming clock signal is delayed by the adjusted variable delay of the variable delay element 12 and the constant delay of the constant delay element 15 and is then relayed to the second input of the phase detector 11. The phase detector 11 compares the received delayed clock signal with the incoming clock signal and, again, adjusts the variable delay of the variable delay element 12, i.e., increases (or decreases) the variable delay by a predetermined process if the two clock signals are not in phase. Then again, a new cycle begins and the process is iterated until the DLL is "locked", i.e. the incoming clock signal and the delayed clock signal which is the outgoing clock signal are in phase.

It is noted that the phase detector 11 either increases the variable delay in each cycle until the two clock signals at its input are in phase or decreases the variable delay in each cycle until the two clock signals are in phase.

Thus, it is guaranteed that the DLL locks after a certain maximum of cycles at the latest, the maximum being the period of the incoming clock signal divided by the predetermined process for adjusting the variable delay of the variable delay element 12.

Therefore, a DLL requires only a rather short period of time to reach a "locked state", i.e. the incoming and outgoing clock signals are in phase. However, if the incoming clock signal includes clock-jitter the clock-jitter of the incoming clock signal will be directly transferred to the outgoing clock signal. Such clock-jitter can severely degrade the quality of outgoing data since the falling and rising edges of a read-data-eye during which outgoing data is to be transmitted will become blurred.

In contrast to a conventional DLL, a phase lock loop (PLL) is capable of filtering clock-jitter of an incoming clock signal. However, a PLL requires a substantially longer period of time to reach a "locked state".

Therefore, there e.g., exists a need for a clock signal synchronizing device which both filters clock-jitter of an incoming clock signal and requires only a short period of time to reach a "locked state".

For these or other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

As used herein, the term "electrically coupled" or "connected" is not meant to mean that elements must be directly coupled or connected together, and intervening elements may be provided between the "electrically coupled" or "connected" elements.

Figure 1:
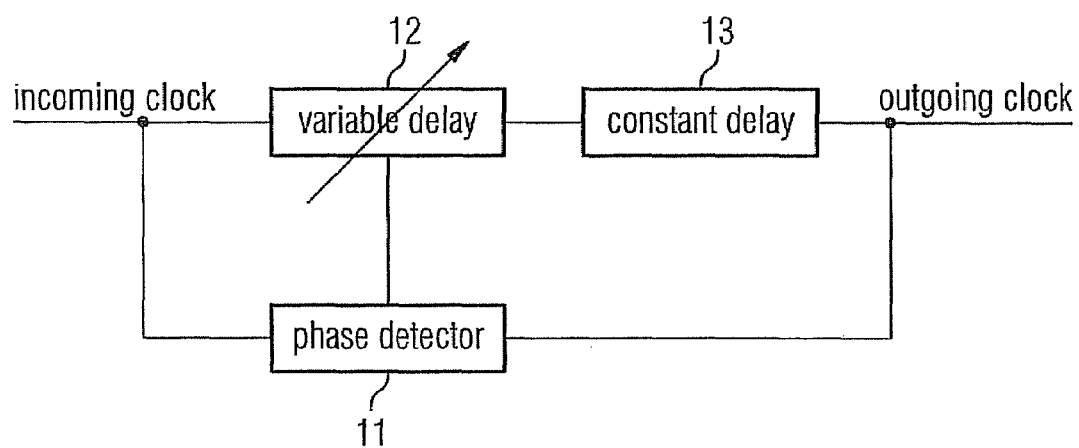
FIG. 1 illustrates a simplified schematic diagram of an exemplary conventional DLL.
Figure 2:
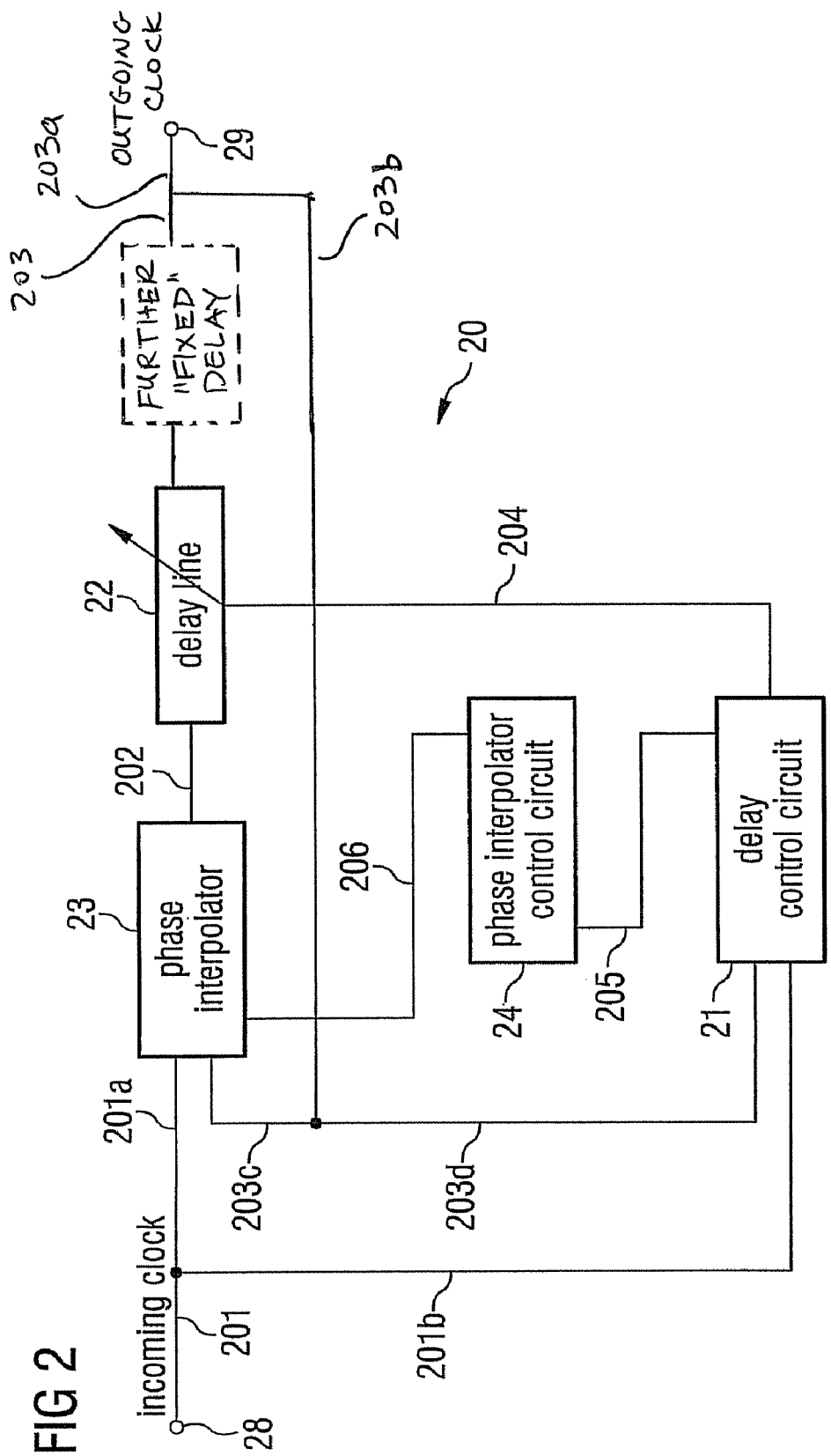
FIG. 2 illustrates a simplified exemplary schematic diagram of a circuit having a DLL according to one embodiment.

FIG. 2 illustrates a simplified exemplary schematic diagram of a circuit having a DLL according to one embodiment. In one embodiment, the circuit is part of an integrated circuit.

The DLL 20 includes a delay control circuit 21, a delay circuit 22, hereinafter referred to as delay line, a phase interpolator 23, a phase interpolator control circuit 24, an input 28, and an output 29.

The delay control circuit 21 has a first input connected to the input 28 of the DLL 20 via connection 201 and connection 201b and a second input connected to an output of the delay line 22 via connection 203, connection 203b, and connection 203d. A first output of the delay control circuit 21 is connected to a second input of the delay line 22 via connection 204 and a second output is connected to an input of the phase interpolator control circuit 24 via connection 205.

The delay line 22 has a first input connected with an output of the phase interpolator 23 via connection 202 and the second input connected with the first output of the delay control circuit 21. An output of the delay line 22 is connected with the second input of the delay control circuit 21 and is also connected with a second input of the phase interpolator 23 via connection 203, connection 203b and connection 203c.

The phase interpolator 23 has a first input connected to the input 28 of the DLL 20 via connection 201 and connection 201a, the second input connected to the output of the delay line 22, and a third input connected to an output of the phase interpolator control circuit 24 via connection 206. The output of the phase interpolator 23 is connected to the input of the delay line 22.

The phase interpolator control circuit 24 has its input connected to the second output of the delay control circuit 21 and its output connected to the third input of the phase interpolator 23.

The delay line having a variable delay is initialized with a predetermined value, which may be calculated, for example, by using a suitable algorithm and which represents a delay expected for a corresponding circuit. During operation of the DLL 20, the variable delay of the delay line 22 is controlled by the delay control circuit 21.

The phase interpolator 23 receives two clock signals at its inputs, an incoming clock signal at its first input and a delayed clock signal received from the output of the delay circuit 22 at its second input and adds the two clock signals with variable quantifiers. The variable quantifiers are controlled by the phase interpolator control circuit 24 and represent factors with which the two clock signals are multiplied before adding them. The incoming clock signal is multiplied with a factor of (1−p) and the delayed signal is multiplied with a factor of p, p being a real number greater than or equal to 0 and smaller than or equal to 1.

However, for a correct operation of the DLL 20, the DLL has first to be in a "locked state", i.e. the incoming clock signal and an outgoing clock signal which is the delayed clock signal at the output of the delay line have to be phase aligned, before activating the phase interpolator 23. When the phase interpolator 23 is not activated the factor p is set to 0 by the phase interpolator control circuit 24 which results in forwarding the incoming clock signal without any modification as, in this case, the incoming clock signal is multiplied with 1, whereas the delayed clock signal is multiplied with 0. Therefore, when the DLL 20 is not in a "locked state" the delay line 22 receives the incoming clock signal at its first input and delays the incoming clock signal by the variable delay controlled by the delay control circuit 21.

Thus, as long as the DLL 20 is not in a locked state, the DLL 20 operates in a way analog to a conventional DLL:

The delay line 22 receives the incoming clock signal at its first input and delays the incoming clock signal by the variable delay controlled by the delay control circuit 21. The delay control circuit 21 compares the phases of the incoming clock signal and the delayed clock signal and, if the two clock signals are not in phase, adjusts the variable delay of the delay line 22, i.e., increases the variable delay by a predetermined process. In other embodiments, the delay control circuit 21 may decrease the variable delay by a predetermined process.

The delayed/outgoing clock signal is then relayed from the output of the delay line 22 to the second input of the delay control circuit 21. Then, a new cycle begins and the delay control circuit compares the outgoing clock signal with the incoming clock signal and, again, adjusts the variable delay of the delay line 22, i.e. increases (or e.g., decreases) the variable delay by a predetermined process if the two clock signals are not in phase. The resulting outgoing clock signal is then relayed from the output of the delay line 22 to the second input of the delay control circuit 21. Then again, a new cycle begins and the process is iterated until the DLL is "locked" i.e. the incoming clock signal and the outgoing clock signal are in phase.

It is noted that the delay control circuit 21 either increases the variable delay in each cycle until the two clock signals at its input are in phase or decreases the variable delay in each cycle until the two clock signals are in phase.

Thus, it is guaranteed that the DLL locks after a certain maximum of cycles at the latest, the maximum being the period of the incoming clock signal divided by the predetermined process for adjusting the variable delay of the delay line 22.

The delay line 22 may include a counter which counts the number of predetermined processes by which the variable delay of the delay line 22 is increased (decreased). Each time the counter receives a respective signal from the delay control circuit via connection 204, a count of the counter is increased (decreased) by 1. In this case, the count (together with the predetermined value for the initialization of the delay line 22) specifies the value of the variable delay of the delay line 22.

The DLL 20 may further include a delay circuit having a constant delay, hereinafter also referred to as constant delay element, which may be placed directly after the delay line 22. The constant delay of the constant delay element may adjusted suitably to replace the abovementioned initialization of the delay line 22 with the predetermined value so that the variable delay of the delay line starts with 0.

As illustrated above, the DLL will be in a "locked state" after running through a certain limited number of cycles.

Up to this point, clock-jitter has not been taken into account. As in a conventional DLL, incoming clock-jitter has been directly transferred. In general, however, this is not critical since, during a start of a system, an associated controller responsible for generating the (incoming) clock signal—and also for introducing clock-jitter—includes a rather low activity whereas low activity of the controller means low clock-jitter of the generated clock-signal. Activity of the controller will not be high until a certain time and at this point, when the activity of the controller increases, the DLL 20 will already be in a "locked state".

Only then, when the incoming clock signal and the outgoing clock signal are in phase, the phase interpolator control circuit 24 receives a respective signal from the delay control circuit 21 via connection 205 and activates the phase interpolator.

As mentioned before, in the phase interpolator 23, the factor p is set to 0 by the phase interpolator control circuit 24 when the phase interpolator 23 is not activated. For controlling the phase interpolator 23, the phase interpolator control circuit 24 may send a control signal having a respective value for the factor p: To deactivate the phase interpolator 23 and cause the phase interpolator 23 to remain deactivated, respectively, the phase interpolator control circuit may send a "0" to the phase interpolator. To activate the phase interpolator 23 and cause the phase interpolator 23 to remain activated, respectively, the phase interpolator control circuit 24 may send a signal indicating a real number greater than 0 and smaller than or equal to 1 to the phase interpolator.

The phase interpolator 23 statically phase-mixes the incoming clock signal and the outgoing clock signal (signal at the output of the delay line) to a contribution of p for the outgoing clock signal and to a contribution of (1−p) for the incoming signal.

In general, the clock-jitter is introduced by the clock-jitter of the incoming signal and is transferred to the outgoing signal. In a conventional DLL, the clock-jitter of the incoming clock signal is directly transferred to the outgoing signal. In a DLL according to one embodiment, however, clock-jitter of the incoming clock signal is filtered by the phase interpolator 23 by phase-mixing the incoming and outgoing clock signals for several cycles:

At its first input, the phase interpolator receives the incoming clock signal and weights (i.e. multiplies) it with a factor of (1−p). At its second input, the phase interpolator receives the outgoing clock signal from the output of the delay line 22 and weights (i.e. multiplies) it with a factor of p. Then, the two weighted clock signals are added. The resulting compounded signal is then relayed to the delay line 22 and delayed. The delayed compounded signal which represents the outgoing signal is then fed back to the second input of the phase interpolator 23 and a new cycle starts. To filter the clock-jitter of the incoming signal effectively, multiple cycles are carried out in the way described above to average out uncorrelated clock-jitter of the incoming clock signal.

As the DLL 20 is in a "locked state" when the phase interpolator 23 is activated, the incoming and outgoing clock signals are identical except for a phase difference of a integer multiple n of the clock signal period $2\pi$, i.e. $n*2\pi$, and except for clock-jitter. However, the clock-jitter of the outgoing signal is also "delayed" or rather phase shifted by $p*2\pi$.

Thus, the signal generated by the phase interpolator is an overlap signal of two "in-phase" signals and is therefore, of course, also in phase with the incoming signal. Under the, in general, justified assumption that the clock-jitter of the incoming clock signal is uncorrelated, in particular non periodical, the "original" clock-jitter of the incoming clock signal and the "delayed" clock-jitter of the outgoing clock signal add in the same way as clock-jitters of different sources. Therefore, after several feedback loop cycles, multiple waves (clock signals) in the resonantly operated delay line 22 are overlapped such that the uncorrelated clock-jitters are averaged out.

A first-order mathematical description of the clock-jitter filtering of the DLL 20 operated resonantly will be given in the following.

The voltage level $V_{out}(t)$ of the outgoing clock signal can be written as:

$$V_{out}(t) = (1-p) \cdot V_{in}(t-T) + p \cdot V_{out}(t-T)$$

For the second cycle, $V_{out}$ can be written as:

$$V_{out}(t) = (1-p) \cdot V_{in}(t-T) + \\ + p[(1-p) \cdot V_{in}(t-2T) + p \cdot V_{out}(t-2T)]$$

For the $N^{th}$ cycle, $V_{out}(t)$ can be written as:

$$V_{out}(t) = (1-p) \cdot \sum_{n=1}^{N} p^{n-1} \cdot V_{in}(t-nT) \quad (1)$$

wherein:
$V_{in}(t)$ is the voltage level of the incoming clock signal;
T is the delay of the delay line.

As the DLL 20 is operated in resonance, T is an integer multiple m of the incoming clock period $t_{ck}$: $T = m*t_{ck}$ First, an incoming clock signal not having any clock-jitter is to be considered. In this case, the following equation is true for $V_{in}(t)$: $V_{in}(t-n*T) = V_{in}(t-n*m*t_{ck}) = V_{in}(t)$ Herewith, equation (1) can be written as:

$$V_{out}(t) = V_{in}(t) \cdot (1-p) \cdot \sum_{n=1}^{N} p^{n-1} \text{ or}$$

$$V_{out}(t) = V_{in}(t) \cdot (1-p) \cdot \sum_{n=0}^{N-1} p^{n}$$

for $N \to \infty$, and $p<1$, the upper equation is an infinite geometric series and can be transformed to:

$$V_{out}(t) = V_{in}(t) \cdot (1-p) \cdot \sum_{n=0}^{\infty} p^{n}$$
$$= V_{in}(t) \cdot (1-p) \cdot \frac{1}{1-p}$$
$$= V_{in}(t)$$

Therefore, with the incoming clock signal having no clock-jitter the voltage levels of the incoming and outgoing clock signals are equal ($V_{in}(t) = V_{out}(t)$) and the DLL functions similar to a conventional DLL.

Next, an incoming clock signal specified by a simple sine wave having phase noise (representing the clock-jitter) is to be considered:

$$V_{in}(t) = V_i \cdot \exp(j \cdot \omega t + j \cdot \phi(t)) \quad (2)$$

equation (2) inserted in equation (1) for $N \to \infty$ leads to:

$$V_{out}(t) = (1-p) \sum_{n=1}^{\infty} p^{n-1} \cdot V_i \cdot \exp(j \cdot \omega t - j \cdot \omega \cdot nT + j \cdot \varphi(t-nT)) \quad$$

which can be simplified considering $\omega*nT = \omega*n*m*t_{ck} = n*m*2\pi$:

$$V_{out}(t) = (1-p) \cdot V_i \cdot \exp(j \cdot \omega t) \sum_{n=1}^{\infty} p^{n-1} \cdot \exp(j \cdot \varphi(t-nT)) \quad (3)$$

Considering equation (2), the term $(V_i*\exp(j*\omega t))$ represents a jitter-free base signal of the incoming signal $V_{in}(t)$.

Assuming a small value for the phase noise $\phi(t)$ the term $\exp(j\phi(t))$ representing the clock jitter is approximated using a first order Taylor series approximation ($\exp(j\phi(t)) \approx 1 + j\phi(t)$):

$$\sum_{n=1}^{\infty} p^{n-1} \exp(j\varphi(t-nT)) \approx \sum_{n=1}^{\infty} p^{n-1}(1 + j\varphi(t-nT)) =$$
$$= \sum_{n=1}^{\infty} p^{n-1} + \sum_{n=1}^{\infty} p^{n-1} \cdot \varphi(t-nT) =$$
$$= \frac{1}{1-p} + \sum_{n=1}^{\infty} p^{n-1} \cdot \varphi(t-nT) \quad \text{(for } p<1\text{)}$$

inserted in equation (3):

$$V_{out}(t) \approx V_i \cdot \exp(j \cdot \omega t)\left(1 + j(1-p)\sum_{n=1}^{\infty} p^{n-1} \cdot \varphi(t-nT)\right)$$

now assuming p→1 ("100% feedback"):

$$V_{out}(t) \approx V_i \exp(j\omega t)\left(1 + \sum_{n=1}^{\infty} \varphi(t-nT)\right) \to V_i \exp(j\omega t)$$

(for uncorrelated phase noise)

therefore: $V_{out}(t) \approx V_i \exp(j\phi t)$ wherein ($V_i*\exp(j*\phi t)$) represents the jitter-free base signal of the incoming signal $V_{in}(t)$.

Figure 3:
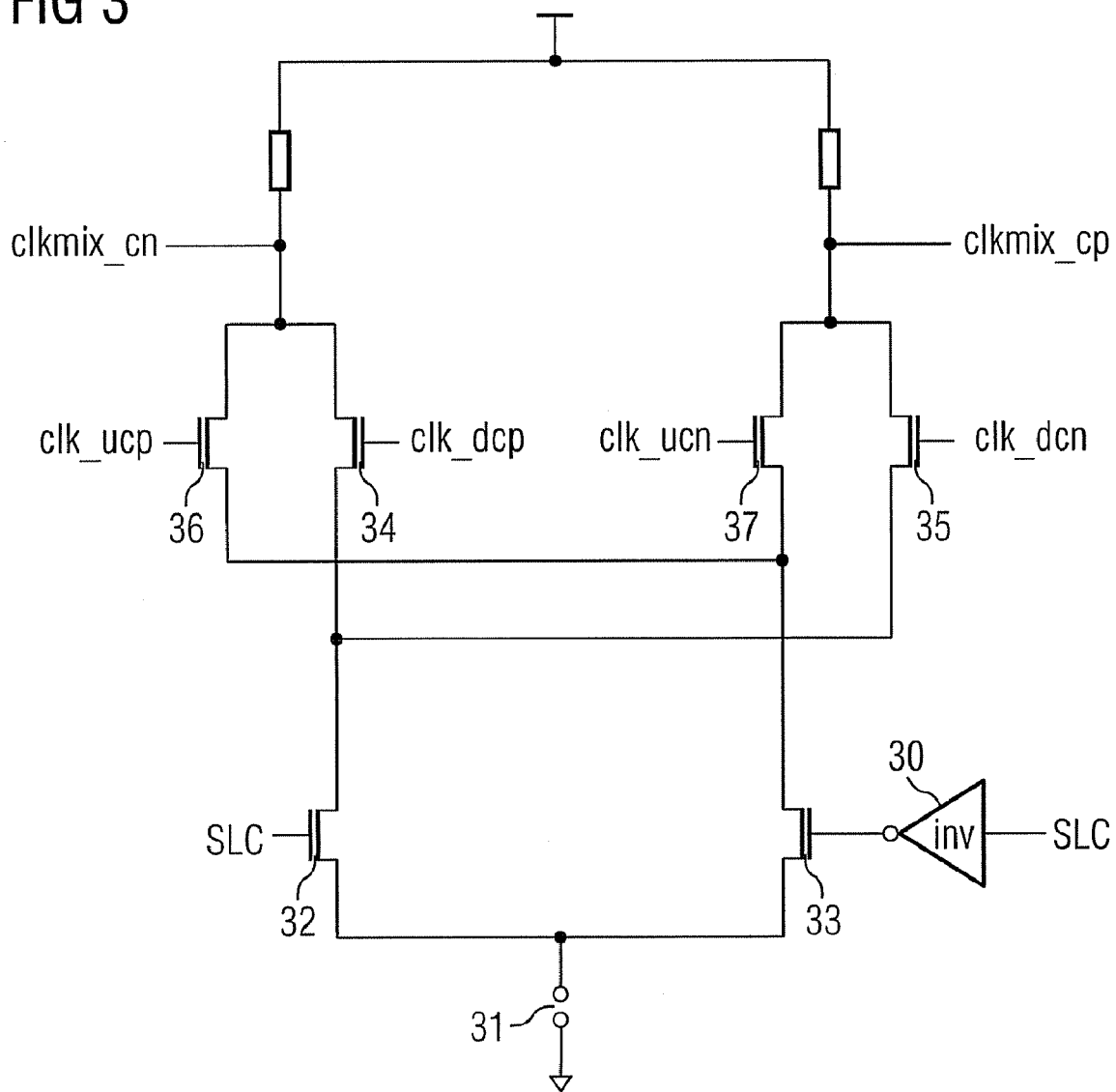
FIG. 3 illustrates a simplified schematic diagram of an exemplary implementation of the phase interpolator of the DLL in FIG. 2.

FIG. 3 illustrates a simplified schematic diagram of an exemplary implementation of the phase interpolator 23 of the DLL 20 in FIG. 2.

In the phase interpolator 23 illustrated in FIG. 3, differential clock signals are used. A differential clock signal consists of two complementary clock signals. The "actual" clock signal can be determined by comparing the two complementary clock signals. If the first clock signal of the two complementary clock signals is higher than the second one the "actual" clock signal is, for example, high ("1"). If the second clock signal of the two complementary clock signals is higher than the first one the "actual" clock signal is, for example, low ("0").

The phase interpolator 23 includes a power source, an inverter 30, two sets of transistors 32, 33, and transistors 34, 35, 36, and 37.

The two sets of transistors 32 and 33 are respectively, for example, 15 transistors each of which can be independently driven by respective gate voltages. In order to control the gates of these transistors, the factor p is converted (not illustrated in FIG. 3) to a thermometer code, which consist in this example of fifteen bits. The proportion of the number of "1's" to the total number of bits, in this example 15 bits, may represent the factor p. In the following, some examples will be given:

a factor of 0 is represented by "000000000000000",
a factor of 1 is represented by "111111111111111"
a factor of ⅓ is represented by "111110000000000", and
a factor of ⅘ is represented by "111111111111000"
in thermometer code.

The first set of transistors 32 are controlled by a received control signal SLC in thermometer code consisting of 15 bits and representing the factor p. Each bit of the thermometer code controls the gate of a respective transistor of the set of transistors 32. If the respective bit is a "1" the corresponding transistor will be on, i.e. a current will flow through its drain and source. If the respective bit is a "0" the corresponding transistor will be off, i.e. no current will flow through its drain and source.

The second set of transistors 33 are also controlled by the control signal SLC in thermometer code. However, the control signal SLC is inverted before being applied to the respective gates of the set of transistors 33, otherwise the control mechanism is the same as the one applied to the first set of transistors 32. The inversion of the control signal involves that the number of on-transistors of the second set of transistors 33 corresponds to the number of off-transistors of the first set of transistors 32 and vice versa.

In the following, the functionality of the phase interpolator 23 will only briefly be described on the basis of two extreme examples as the phase interpolator illustrated in FIG. 3 is a conventional phase interpolator well-known in the art.

First, the value of SLC is assumed to be "000000000000000". In this case, each transistor of the second set of transistors 33 is on and each transistor of the first set of transistors 32 is off. Therefore, voltage will be applied only to the transistors 36 and 37 which are connected to the transistors 33. The transistors 36 and 37 are controlled by differential clock signals clk_ucp and clk_ucn representing the incoming clock signal in FIG. 2. In this case, the differential clock signals, clkmix_cp and clkmix_cn, output by the phase interpolator 23 correspond to the incoming clock signal in FIG. 2 (represented as differential clock signals).

Next, the value of SLC is assumed to be "111111111111111". In this case, each transistor of the second set of transistors 33 is off and each transistor of the first set of transistors 32 is on. Therefore, voltage will be applied only to the transistors 34 and 35 which are connected to the transistors 32. The transistors 34 and 35 are controlled by differential clock signals clk_dcp and clk_dcn representing the outgoing clock signal in FIG. 2. In this case, the differential clock signals, clkmix_cp and clkmix_cn, output by the phase interpolator 23 correspond to the outgoing clock signal in FIG. 2 (represented as differential clock signals).

For values of SLC lying in between the above two extreme examples, each of the transistors 34, 35, 36, and 37 will make some contribution—according to the value of SLC—to the clock signal output by the phase interpolator 23. For these cases, the phase interpolator 23 statically phase-mixes the incoming and outgoing clock signals to a contribution of p for the outgoing clock signal and to a contribution of (1−p) for the incoming clock signal.

Figure 4:
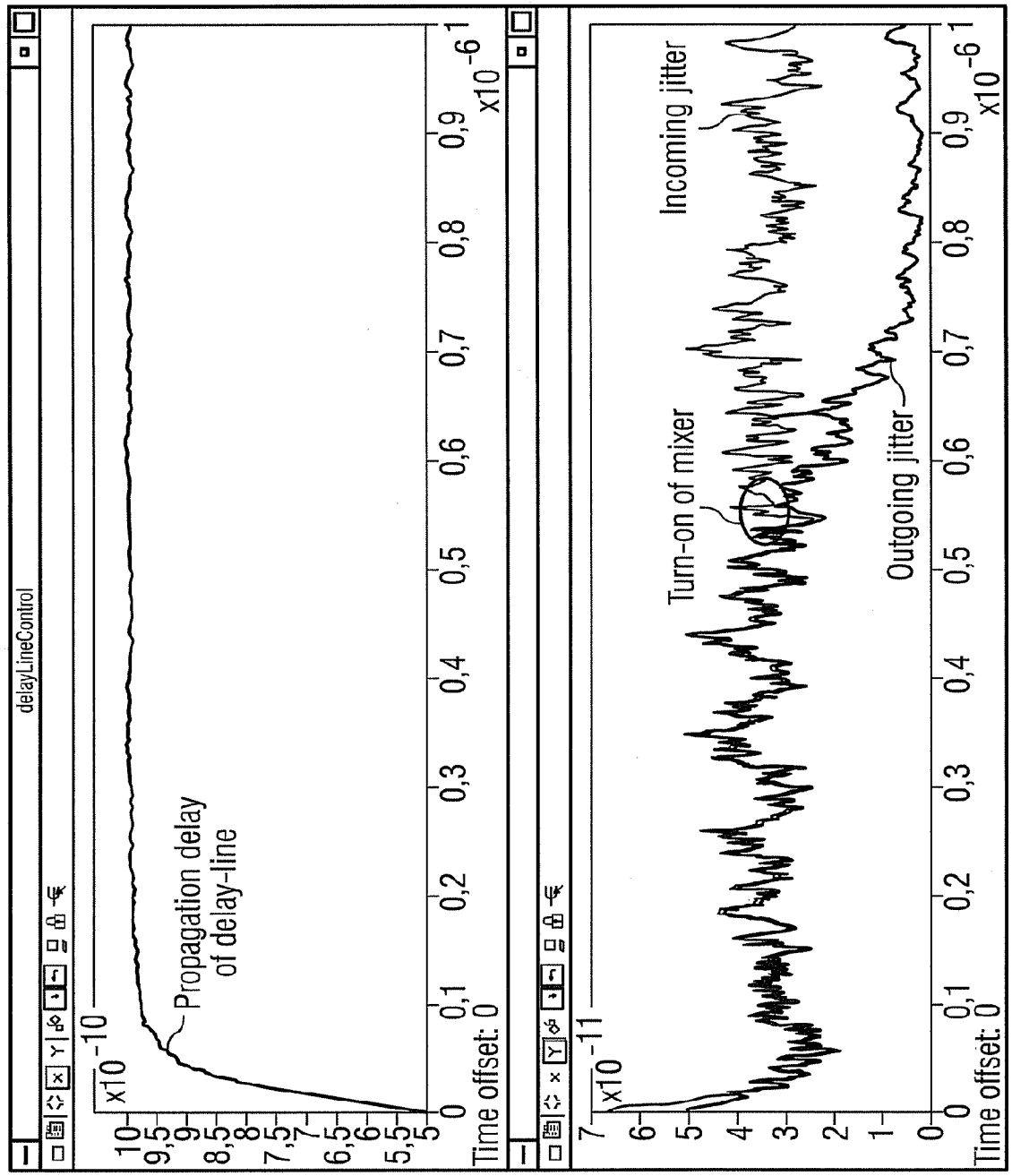
FIG. 4 depicts a graph showing a Matlab simulation result for the jitter of an incoming and outgoing clock signal filtered by a simulated DLL according to one embodiment.

FIG. 4 depicts a graph illustrating a Matlab simulation result for clock-jitter of an incoming and an outgoing clock signal filtered by a simulated DLL according to one embodiment.

The upper graph of FIG. 4 illustrates the time required to lock-in the DLL by displaying the propagation delay of a delay line having a variable delay time comprised in the DLL.

The lower graph of FIG. 4 illustrates the progression of clock-jitter of the incoming and outgoing clock signals over time. To allow the DLL to reach a "locked state", a phase interpolator, designated as "mixer" in the graph, starts with a contribution of 0% for the outgoing clock. During this period, incoming clock-jitter is transferred without modification to the outgoing clock. Between 500 ns and 700 ns, contribution of the outgoing clock signal is increased from 0% to 90% and clock-jitter suppression by the resonant DLL gets visible.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit having a clock signal synchronizing device comprising:
   a delay circuit having a variable delay time, the delay circuit configured to delay a compound signal by the variable delay time to provide a delayed clock signal at an output; and
   a phase interpolator configured to add an incoming clock signal multiplied with a factor of substantially (1−p) to the delayed clock signal multiplied with a factor of substantially p to generate the compound signal, p being a real number greater than or equal to 0 and smaller than or equal to 1.

2. The integrated circuit of claim 1, comprising:
   a phase interpolator control circuit configured to set the value of p to substantially 0 when the incoming clock signal and the delayed clock signal are not in phase, and sets the value of p to a value greater than 0 and smaller than or equal to 1 when the incoming clock signal and the delayed clock signal are in phase.

3. The integrated circuit of claim 2, comprising where phase interpolator and phase interpolator control circuit are configured to operate iteratively over a plurality of cycles to average out uncorrelated clock-jitter comprised in the incoming clock signal.

4. The integrated circuit of claim 1, comprising:
   a delay control circuit for controlling the delay circuit to adjust a phase relation between the incoming clock signal and the delayed clock signal.

5. The integrated circuit of claim 4, further comprising a further delay circuit having a constant delay time and being connected between the output of the delay circuit having the variable delay time and the delay control circuit so that the delayed clock signal is further delayed by the constant time delay.

6. The integrated circuit of claim 4, comprising wherein the variable delay time of the delay circuit is adjusted by respectively incrementing the variable delay time by a predetermined process until the incoming clock signal and the delayed clock signal fed back from the output of the delay circuit are in phase.

7. The integrated circuit of claim 1, comprising wherein the incoming clock signal is a differential clock signal.

8. A circuit having a clock signal synchronizing device comprising:
   a delay circuit having a variable delay time and delaying compound signal by the variable delay time to output a delayed clock signal;
   a delay control circuit for controlling the delay circuit to adjust the phase relation between an incoming clock signal and the delayed clock signal;
   a phase interpolator, configured to add the incoming clock signal multiplied with a factor of substantially (1−p) to the delayed clock signal multiplied with a factor of substantially p to output the compound signal to the delay circuit, p being a real number greater than or equal to 0 and smaller than or equal to 1; and
   a phase interpolator control circuit, configured to set the value of p to substantially 0 when the incoming clock signal and the delayed clock signal output by the delay circuit are not in phase, and sets the value of p to a value greater than 0 and smaller than or equal to 1 when the incoming clock signal and the delayed clock signal output by the delay circuit are in phase.

9. The circuit of claim 8, further comprising a further delay circuit having a constant delay time and being connected between an output of the delay circuit having a variable delay time and an input of the delay control circuit.

10. The circuit of claim 8, comprising wherein the incoming clock signal is a differential clock signal.

11. The circuit of claim 8, comprising wherein the variable delay time of the delay circuit is adjusted by respectively incrementing the variable delay time by a predetermined process until the incoming clock signal and the delayed clock signal fed back from the output of the delay circuit are in phase, wherein the process is carried out iteratively over a plurality of cycles to average out uncorrelated clock-jitter comprised in the incoming clock signal.

12. The circuit of claim 8, comprising wherein the variable delay time of the delay circuit is adjusted by respectively decrementing the variable delay time by a predetermined process until the incoming clock signal and the delayed clock signal fed back from the output of the delay circuit are in phase, wherein the processes is carried out iteratively over a plurality of cycles to average out uncorrelated clock-jitter comprised in the incoming clock signal.

13. A device comprising:
   a delay circuit having a variable delay time and delaying a compound signal by the variable delay time to output a delayed clock signal;
   a delay control circuit for controlling the delay circuit to adjust the phase relation between an incoming clock signal and the delayed clock signal;
   a phase interpolator; wherein
   the phase interpolator is activated when the incoming clock signal and the delayed clock signal fed back from an output of the delay circuit are substantially in phase and adds the incoming clock signal multiplied with a factor of substantially (1−p) to the delayed clock signal multiplied with a factor of substantially p to output the compound signal to the delay circuit, p being a real number greater than or equal to 0 and smaller than or equal to 1.

14. The device of claim 13, further comprising a further delay circuit having a constant delay time and being connected between the output of the delay circuit having a variable delay time and an input of the delay control circuit.

15. The device of claim 13, comprising wherein the incoming clock signal is a differential clock signal.

16. The device of claim 13, further comprising a phase interpolator control circuit connected to the phase interpolator, the phase interpolator control circuit generating a control signal comprising a value for the factor p being greater than 0 to activate the phase interpolator.

17. A method for operating a circuit having a delay control circuit connected to a delay circuit having a variable delay time, and a phase interpolator, comprising:
   receiving an incoming clock signal;
   delaying, with the delay circuit, a compound signal to generate a delayed clock signal;
   controlling, with the delay control circuit, the variable delay time of the delay circuit to adjust the phase relation between the incoming clock signal and the delayed clock signal; and
   when the incoming clock signal and the delayed clock signal fed back from an output of the delay circuit are substantially in phase, adding, with the phase interpolator, the incoming clock signal multiplied with a factor of substantially (1−p) to the delayed clock signal multiplied with a factor of substantially p to output the compound signal, p being a real number greater than or equal to 0 and smaller than or equal to 1.

18. The method of claim 17, comprising carrying out the controlling and adding iteratively over a plurality of cycles to average out uncorrelated clock-jitter comprised in the incoming clock signal.

19. The method of claim 17, comprising causing the phase interpolator to operate by a control signal comprising a value for the factor p being greater than 0.

20. The method of claim 17, comprising adjusting the variable delay time of the delay circuit by respectively incrementing the variable delay time by a predetermined process until the incoming clock signal and the delayed clock signal fed back from the output of the delay circuit are in phase.

21. The method of claim 17, comprising adjusting the variable delay time of the delay circuit by respectively decrementing the variable delay time by a predetermined process until the incoming clock signal and the delayed clock signal fed back from the output of the delay circuit are in phase.

22. The method of claim 17, wherein the device comprises an integrated circuit.

* * * * *